(12) United States Patent
Takama

(10) Patent No.: US 7,256,530 B2
(45) Date of Patent: Aug. 14, 2007

(54) PIEZOELECTRIC TRANSFORMER DRIVE CIRCUIT AND COLD CATHODE TUBE LIGHTING APPARATUS

(75) Inventor: Kinya Takama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 291 days.

(21) Appl. No.: 11/081,761

(22) Filed: Mar. 16, 2005

(65) Prior Publication Data

US 2005/0206273 A1    Sep. 22, 2005

(30) Foreign Application Priority Data

Mar. 19, 2004  (JP) .............................. 2004-081090

(51) Int. Cl.
*H01L 41/08* (2006.01)
(52) U.S. Cl. ................................. 310/316.01
(58) Field of Classification Search ........... 310/316.01, 310/31, 7
See application file for complete search history.

(56) References Cited

U.S. PATENT DOCUMENTS

| | | | | |
|---|---|---|---|---|
| 5,705,879 | A * | 1/1998 | Abe et al. ..................... | 310/359 |
| 5,739,622 | A * | 4/1998 | Zaitsu .................... | 310/316.01 |
| 6,188,163 | B1 * | 2/2001 | Danov ........................ | 310/366 |
| 6,198,198 | B1 * | 3/2001 | Fujimura et al. ....... | 310/316.01 |

FOREIGN PATENT DOCUMENTS

| | | |
|---|---|---|
| JP | 08-146697 | 6/1996 |
| JP | 10-285942 A | 10/1998 |
| JP | 2001-136749 | 5/2001 |
| JP | 2003-164163 | 6/2003 |
| JP | 2004-39336 | 2/2004 |

OTHER PUBLICATIONS

Official communication issued in the corresponding Japanese Application No. 2004-081090, mailed on Oct. 10, 2006.
Official communication issued in the counterpart JP Application No. 2004-081090, mailed Apr. 11, 2007.

* cited by examiner

*Primary Examiner*—Mark Budd
(74) *Attorney, Agent, or Firm*—Keating & Bennett, LLP (57) ABSTRACT

A piezoelectric transformer drive circuit of a full-bridge type having high efficiency minimizes the effect of voltage fluctuation of an input voltage $V_{CC}$. The piezoelectric transformer drive circuit includes transistors that drive primary electrodes of a piezoelectric transformer, an inductor, a tube current detection circuit, a first error amplifier, a voltage controlled oscillator that outputs an oscillation clock and a triangular wave signal, an applied difference voltage generating circuit that outputs the difference between the voltages of the primary electrodes, an applied voltage detection circuit, a second error amplifier, a PWM comparator that compares this voltage with the triangular wave signal and outputs a PWM signal, a frequency divider that frequency-divides the oscillation clock, an AND circuit that controls the transistors by computing the AND of the output signal thereof and the PWM signal, and an AND circuit that controls the transistors by computing the AND of an inverted signal of the output signal of frequency divider and the PWM signal.

20 Claims, 5 Drawing Sheets

PIEZOELECTRIC TRANSFORMER DRIVE CIRCUIT AND COLD CATHODE TUBE LIGHTING APPARATUS

BACKGROUND OF THE INVENTION

1. Field of the Invention

The present invention relates to a piezoelectric transformer drive circuit that drives a piezoelectric transformer including a pair of primary electrodes and a secondary electrode, that steps up an AC voltage applied to the pair of primary electrodes and outputs the stepped up voltage from the secondary electrode. The present invention also relates to a cold cathode tube lighting apparatus including such a piezoelectric transformer drive circuit.

2. Description of the Related Art

Figure 4:
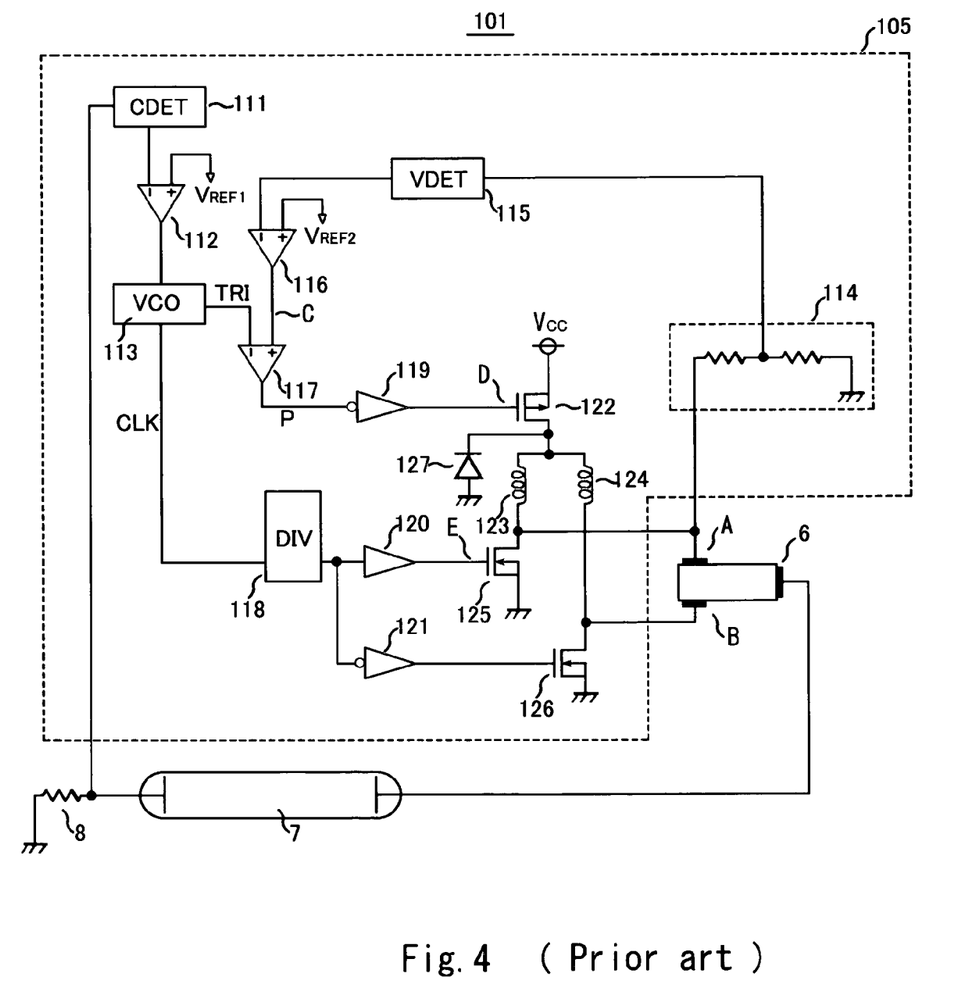
FIG. 4 is a circuit diagram of a piezoelectric transformer drive circuit according to the background art and a cold cathode tube lighting apparatus including such a piezoelectric transformer drive circuit.

Typically, a cold cathode tube is used as a backlighting light source of a liquid crystal panel. In a cold cathode tube lighting apparatus that lights the cold cathode tube, a piezoelectric transformer having a pair of primary electrodes and a secondary electrode is used to supply a high-voltage to the cold cathode tube. A known type of piezoelectric transformer drive circuit that drives such a piezoelectric transformer is a push-pull type transformer drive circuit as disclosed in, for example, Laid-open Japanese Patent Application No. 2004-39336. FIG. 4 shows a piezoelectric transformer drive circuit of the conventional push-pull type wherein feedback control is performed so as to maintain the AC voltage that is applied to the pair of primary electrodes of the piezoelectric transformer constant, and a cold cathode tube lighting apparatus including such a piezoelectric transformer drive circuit. The cold cathode tube lighting apparatus 101 includes a piezoelectric transformer drive circuit 105, a piezoelectric transformer 6 that is driven by the piezoelectric transformer drive circuit 105 and that outputs a high voltage from a secondary electrode, which high voltage is obtained by stepping up the AC voltage applied to a pair of primary electrodes A, B, a cold cathode tube 7 connected as a load to the secondary electrode of the piezoelectric transformer 6 and an impedance element 8, which is a resistor, connected in series with the cold cathode tube 7.

The piezoelectric transformer drive circuit 105 includes a tube current detection circuit (CDET) 111 that detects the signal of an impedance element 8, which is a signal that indicates the condition of a load that is connected to the secondary electrode, and that outputs the peak voltage or an averaged voltage thereof, a first error amplifier 112 that compares the output voltage of the tube current detection circuit 111 that is input at the inversion input terminal thereof and a first error reference voltage $V_{REF1}$ that is input at the non-inversion input terminal thereof and amplifies and outputs the difference voltage, a voltage controlled oscillator (VCO) 113 that is controlled by the output voltage of the first error amplifier 112 and outputs an oscillation clock CLK of a reference period and a triangular wave signal TRI synchronized therewith, an applied voltage detection circuit (VDET) 115 that detects the AC voltage that is applied to a first primary electrode A of the pair of primary electrodes of the piezoelectric transformer 6 and is attenuated by an attenuator 114 including series-connected resistors, and that outputs the peak voltage or an averaged voltage thereof, a second error amplifier 116 that compares the output voltage of the applied voltage detection circuit 115 that is input at the inversion input terminal thereof and a second error reference voltage $V_{REF2}$ that is input at the non-inversion input terminal thereof and amplifies and outputs the difference voltage, a PWM comparator 117 that compares the output voltage (the voltage at node C) of the second error amplifier 116 that is input at the non-inversion input terminal thereof and the triangular wave signal TRI of the voltage control oscillator 113 that is input at the inversion input terminal thereof and outputs a PWM signal P, a P-type MOS transistor 122 that inputs the PWM signal P of the PWM comparator 117 at its gate (node D) through an inversion buffer 119 and that has its source connected to an input power supply $V_{CC}$, a frequency divider (DIV) 118 that divides in frequency the oscillation clock CLK of the voltage controlled oscillator 113, an N-type MOS transistor 125 that receives the output of the frequency divider 118 through a buffer 120 at its gate (node E), whose source is grounded, and whose drain is connected to the first primary electrode A of the piezoelectric transformer 6, an N-type MOS transistor 126 that receives the output of the divider 118 through an inversion buffer 121 at its gate, whose source is grounded, and whose drain is connected to a second primary electrode B of the pair of primary electrodes of the piezoelectric transformer 6, an inductor 123 one end of which is connected to the drain of the N-type MOS transistor 125 and the other end is connected to the drain of the P-type MOS transistor 122, an inductor 124 one end of which is connected to the drain of the N-type MOS transistor 126 and the other end is connected to the drain of the P-type MOS transistor 122, and a free wheeling diode 127 whose cathode is connected with the drain of the P-type MOS transistor 122 and whose anode is grounded.

Figure 5:
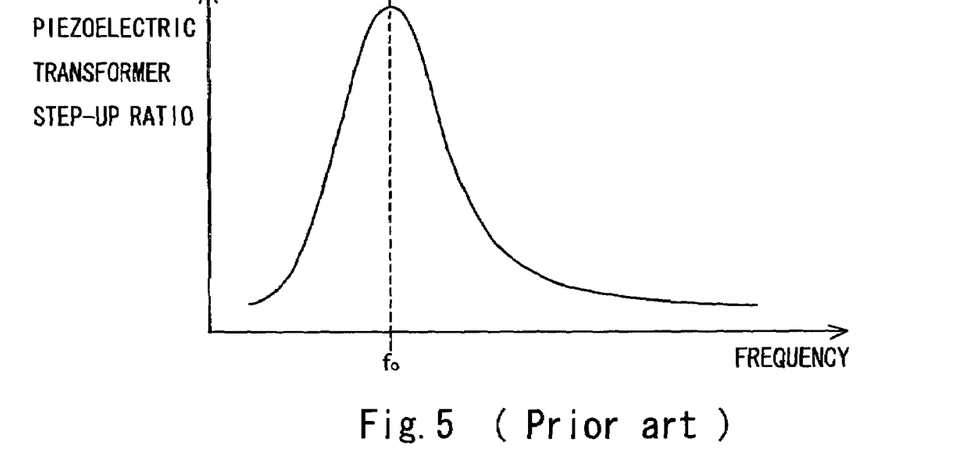
FIG. 5 is a typical characteristic plot of a piezoelectric transformer.

Next, the overall operation of the cold cathode tube lighting apparatus 101 will be described. When an AC voltage is applied to the pair of primary electrodes A, B, the piezoelectric transformer 6 steps up the voltage by the piezoelectric effect and thus, outputs a high voltage from the secondary electrode. The cold cathode tube 7 is lit by application of this high voltage from the piezoelectric transformer 6. The step-up ratio of the piezoelectric transformer 6 depends on the frequency, as shown in FIG. 5 and has a peak at the resonant frequency $f_0$. Accordingly, the power efficiency of the cold cathode tube lighting apparatus 101 has a peak practically in the vicinity of the resonant frequency $f_0$. In the cold cathode tube lighting apparatus 101, the AC frequency at the primary electrodes A, B of the piezoelectric transformer 6 is therefore controlled by feedback of the tube current flowing in the cold cathode tube 7 such that the power efficiency is a maximum, by means of an impedance element 8 and piezoelectric transformer drive circuit 105.

Figure 6:
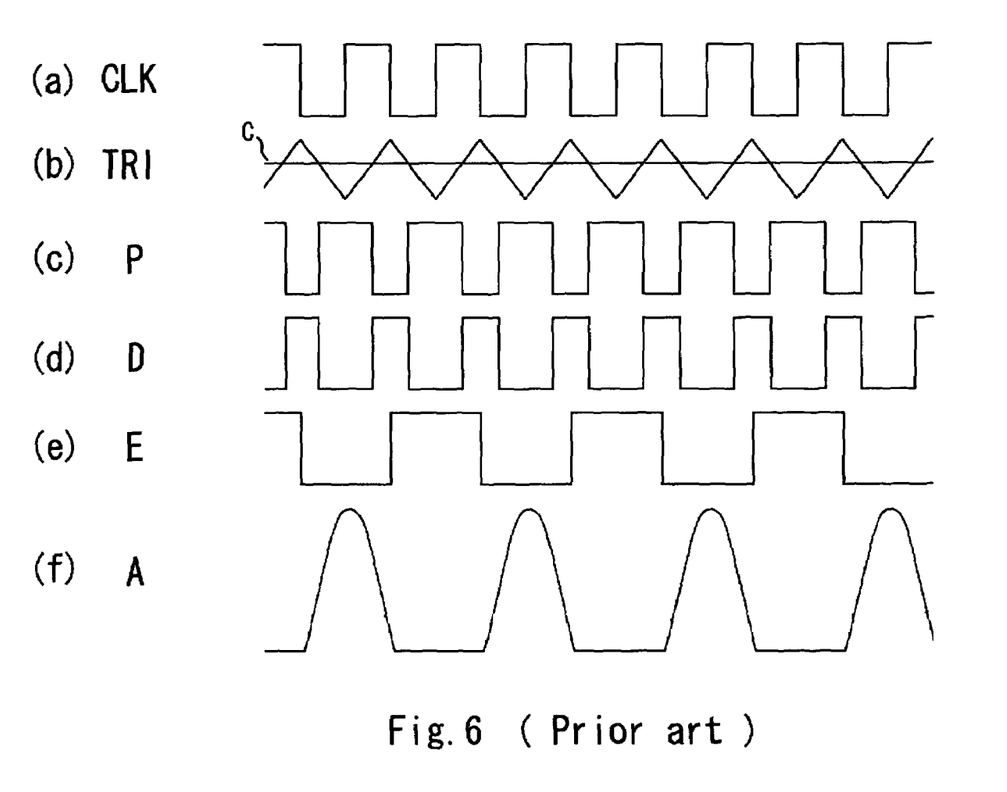
FIG. 6 is a waveform diagram of the various sections of a piezoelectric transformer drive circuit according to the background art.

Next, the operation of the piezoelectric transformer drive circuit 105 will be described. First of all, the voltage waveforms of the various sections for generating the AC voltage applied to the first primary electrode A of the piezoelectric transformer 6 are shown in FIGS. 6(a) to 6(f). FIG. 6(a) shows an oscillation clock CLK of reference period that is output from the voltage-controlled oscillator 113 and FIG. 6(b) is the triangular wave signal TRI thereof. FIG. 6(c) shows the PWM signal P that is output from the PWM comparator 117, which is output as a result of comparison of the triangular wave signal TRI and the output voltage (the voltage at node C) of the second error amplifier 116. The PWM signal P is output to the gate (node D) of the P-type MOS transistor 122 after inversion as in FIG. 6(d) by the inversion buffer 119. In contrast, the oscillation clock CLK is divided in frequency as indicated in FIG. 6(e) by the frequency divider 118 and is input to the gate (node E) of the N-type MOS transistor 125 through the buffer 120 and to the gate of the N-type MOS transistor 126 through the inversion buffer 121. These two transistors 125 and 126 are turned on and off alternately. When the N-type MOS transistor 125 is turned on and the P-type MOS transistor 122 is turned on, current flows from the input power supply $V_{CC}$ to the inductor 123, and energy is thus accumulated. In the next period, when the N-type MOS transistor 125 is turned off, voltage corresponding to the accumulated energy is generated as indicated in FIG. 6(f) and is applied to the first primary electrode A of the piezoelectric transformer 6. Also, although not shown, when the N-type MOS transistor 125 is turned off, the N-type MOS transistor 126 is turned on. When the P-type MOS transistor 122 is turned on, current flows from the input power supply $V_{CC}$ to the inductor 124 and its energy is accumulated. In the next period, when the N-type MOS transistor 126 is turned off, a voltage corresponding to the accumulated energy is generated and is applied to the second primary electrode B of the piezoelectric transformer 6.

Next, the operation for controlling the frequency of the AC voltage at the primary electrode A of the piezoelectric transformer 6 by feedback of the tube current flowing in the cold cathode tube 7 will be described. The tube current flowing in the cold cathode tube 7 is detected by the impedance element 8 and converted to a voltage signal. This voltage signal is detected by the tube current detection circuit 111 and the peak voltage or an averaged voltage thereof is output. The output voltage of the tube current detection circuit 111 and the first error reference voltage $V_{REF1}$ are compared by the first error amplifier 112 and the difference between these two voltages is amplified and output. The voltage-controlled oscillator 113 is controlled by the output voltage of this first error amplifier 112 and an oscillation clock CLK of reference period corresponding to this voltage and a triangular wave signal TRI are output. As described above, the oscillation clock CLK is divided in frequency by the frequency divider 118 and is used to turn the two N-type MOS transistors 125 and 126 on or off alternately. So, the AC voltage is applied to the primary electrodes A, B of the piezoelectric transformer 6 with a period of twice the reference period. If, for example, the tube current flowing in the cold cathode tube 7 is more than a predetermined value, the frequency of the oscillation clock CLK of the voltage controlled oscillator 113 is increased, with a result that the AC frequency applied to the primary electrodes of the piezoelectric transformer 6 is also increased. On the other hand, if the tube current flowing in the cold cathode tube 7 is less than the predetermined value, the AC frequency applied to the primary electrodes of the piezoelectric transformer 6 is decreased. In this way, the tube current flowing in the cold cathode tube 7 is fed back, so that the AC frequency that is applied to the primary electrodes A, B of the piezoelectric transformer 6 is thereby controlled.

Next, the feedback control by which the AC voltage applied to the primary electrodes A, B of the piezoelectric transformer 6 is held constant will be described. The AC voltage that is applied to the first primary electrode A of the piezoelectric transformer 6 is attenuated by the attenuator 114 and is detected by the applied voltage detection circuit 115. The peak voltage or an averaged voltage thereof is output from the applied voltage detection circuit 115. The output voltage of the applied voltage detection circuit 115 is compared with the second error reference voltage $V_{REF2}$ by the second error amplifier 116 and the difference between these two voltages is amplified and output. This output (node C) voltage, as described above, is compared with the triangular wave signal TRI of the voltage controlled oscillator 113 by the PWM comparator 117. The PWM signal P which is the result thereof is inverted by the inversion buffer 119 and output to the gate (node D) of the P-type MOS transistor 122. This output is used to control the time during which current flows from the input power supply $V_{CC}$ to the inductors 123 and 124, i.e., to control the energy accumulated in these inductors. For example, if the AC voltage applied to the primary electrodes A, B of the piezoelectric transformer 6 is larger than a predetermined voltage, the pulse width of the PWM signal P becomes small and the time during which current flows into the inductors 123 and 124 is shortened. On the other hand, if the AC voltage that is applied to the primary electrodes A, B of the piezoelectric transformer 6 is smaller than the predetermined value, the pulse width of the PWM signal P becomes larger and the time during which current flows into the inductors 123 and 124 becomes longer. Consequently, when the voltage of the input power supply $V_{CC}$ is high, the pulse width of the PWM signal P becomes small and the time during which current flows from the input power supply $V_{CC}$ to the inductors 123 and 124 becomes short. On the other hand, if the voltage of the input power supply $V_{CC}$ is low, the pulse width of the PWM signal P becomes large and the time during which current flows from the input power supply $V_{CC}$ to the inductors 123 and 124 becomes long. In this way, the effect of fluctuation of the input power supply $V_{CC}$ on the piezoelectric transformer drive circuit 105 is suppressed by feedback control such that the AC voltage that is applied to the primary electrodes A, B of the piezoelectric transformer 6 is kept constant. Hence, it is possible to prevent a decrease in power efficiency that results from drift in the detection of the tube current flowing in the cold cathode tube 7 as a consequence of fluctuation of the tube current caused by fluctuation of the input power supply $V_{CC}$. For the input power supply $V_{CC}$ of a notebook personal computer, when a commercial AC power source is used and when a battery is used, there is a fluctuation in a voltage range of, for example, about 9 V to about 21 V. So, the cold cathode tube lighting apparatus 101 is particularly advantageous in circumstances where it is used in a notebook personal computer.

Recently, however, a piezoelectric transformer drive circuit of a full-bridge type (see, for example, Laid-Open Japanese Patent Application No. 2001-136749) has been developed in which both primary electrodes of a piezoelectric transformer are driven by a power supply side transistor and a ground side transistor in order to further improve the power efficiency beyond that of a piezoelectric transformer drive circuit of push-pull type. It is said that such a piezoelectric transformer drive circuit of a full bridge type makes it possible to achieve at least 90% power efficiency, compared with about 80% power efficiency for a push-pull type circuit. The inventor of the present application theorized that ,if feedback control, described above, of the AC voltage that is applied to the primary electrodes of the piezoelectric transformer is refined and is applied to such a piezoelectric transformer drive circuit of a full bridge type, the effect of voltage fluctuation of the input power supply $V_{CC}$ could be minimized and it might thereby be possible to realize a piezoelectric transformer drive circuit having high efficiency in a correspondingly wider voltage range of the input power supply $V_{CC}$.

SUMMARY OF THE INVENTION

In view of the foregoing, preferred embodiments of the present invention provide a piezoelectric transformer drive circuit of a highly efficient full bridge type in a wide voltage range of the input power supply $V_{CC}$.

According to a preferred embodiment of the present invention, a piezoelectric transformer drive circuit for a piezoelectric transforming having a pair of primary electrodes and a secondary electrode for stepping up an AC voltage applied to the pair of primary electrodes and outputting the resultant voltage from the secondary electrode includes a first power supply side transistor and a first ground side transistor connected in series between the input power supply and ground potential that output a voltage that is applied to a first primary electrode of the pair of primary electrodes, a second power supply side transistor and a second ground side transistor connected in series between the input power supply and ground potential that output a voltage that is applied to a second primary electrode of the pair of primary electrodes, an inductor interposed between the first primary electrode and a mid-point between the first power supply side transistor and the first ground side transistor, a tube current detection circuit that is arranged to detect a signal indicating the condition of the load that is connected to the secondary electrode, a first error amplifier that is arranged to compare the output voltage of the tube current detection circuit and a first error reference voltage, a voltage controlled oscillator that is controlled by the output voltage of the first error amplifier and that outputs an oscillation clock of a reference period and a triangular wave signal synchronized therewith, an applied voltage detector that is arranged to produce a voltage corresponding the amplitude of the voltage that is applied to at least one of the pair of primary electrodes, a second error amplifier that is arranged to compare the output voltage of the applied voltage detector and a second error reference voltage, a PWM comparator that is arranged to compare the output voltage of the second error amplifier and the triangular wave signal to output a PWM signal, and a frequency divider that is arranged to output a signal whose polarity is changed every reference period, wherein the on time of the PWM signal is the time during which both the first power supply side transistor and the second ground side transistor are on or the time during which both the second power supply side transistor and the first ground side transistor are on, and the first power supply side transistor, the first ground side transistor, the second power supply side transistor and the second ground side transistor are controlled by the output signal of the frequency divider such that the time during which both the first power supply side transistor and the second ground side transistor are on and the time during which both the second power supply side transistor and the first ground side transistor are on are generated alternately in each period of the reference period.

The applied voltage detector preferably includes an applied difference voltage generating circuit whereby the AC voltages that are applied to the pair of primary electrodes are respectively attenuated and their differences output, and an applied voltage detection circuit that is arranged to detect the output of the applied difference voltage generating circuit and outputs the peak voltage or an averaged voltage thereof. Alternatively, the applied voltage detector preferably includes an applied voltage detection circuit that detects the output of the mid-point between the first power supply side transistor and the first ground side transistor or the mid-point between the second power supply side transistor and second ground side transistor and outputs the averaged voltage thereof.

A cold cathode tube lighting apparatus according to another preferred embodiment of the present invention includes a piezoelectric transformer drive circuit according to one of the preferred embodiments described above, a piezoelectric transformer including a pair of primary electrodes and a secondary electrode and that is driven by the piezoelectric transformer drive circuit so as to step up the AC voltage applied to the pair of primary electrodes and output the resultant AC voltage from the secondary electrode, a cold cathode tube connected as a load to the secondary electrode of the piezoelectric transformer, and an impedance element connected in series with the cold cathode tube so that a tube current detection circuit of the piezoelectric transformer drive circuit detects a signal indicating the condition of the load connected to the secondary electrode.

A piezoelectric transformer drive circuit, which is of the full bridge type, according to a preferred embodiment of the present invention, and a cold cathode tube lighting apparatus including this piezoelectric transformer drive circuit according to another preferred embodiment of the present invention, perform feedback control of the voltage applied to at least one of the pair of primary electrodes of the piezoelectric transformer and thus, make it possible to achieve high efficiency in a wide voltage range of the input power supply $V_{CC}$ by suppressing and minimizing the effect of voltage fluctuation of the input power supply $V_{CC}$.

Other elements, characteristics, features, properties, and advantages of the present invention will become clearer from the detailed description of the preferred embodiments of the present invention that is to be described next with reference to the attached drawings.

DETAILED DESCRIPTION OF PREFERRED EMBODIMENTS

Figure 1:
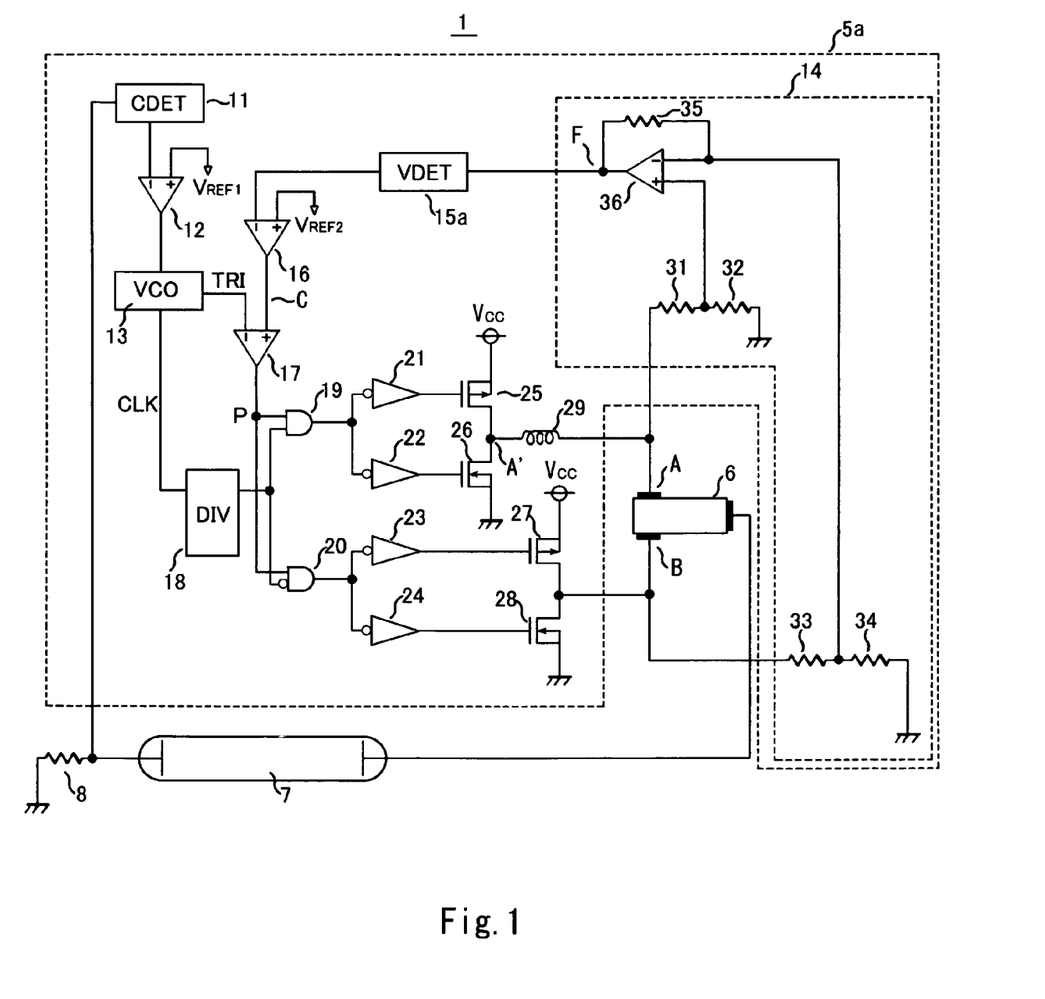
FIG. 1 is a circuit diagram of a piezoelectric transformer drive circuit according to a preferred embodiment of the present invention and a cold cathode tube lighting apparatus including such a piezoelectric transformer drive circuit.

Preferred embodiments of the present invention are described below with reference to the drawings. FIG. 1 shows a piezoelectric transformer drive circuit 5a according to a preferred embodiment of the present invention and a cold cathode tube lighting apparatus 1 including the piezoelectric transformer drive circuit 5a. The cold cathode tube lighting apparatus 1 includes a full bridge type piezoelectric transformer drive circuit 5a, a piezoelectric transformer 6 that is driven by the piezoelectric transformer drive circuit 5a and steps up the AC voltage applied to the pair of primary electrodes A, B and outputs the stepped up AC voltage from the secondary electrode, a cold cathode tube 7 connected as a load to the secondary electrode of the piezoelectric transformer 6, and an impedance element 8, which is preferably a resistor, connected in series with the cold cathode tube 7.

The piezoelectric transformer drive circuit 5a includes a first power supply side transistor 25 and a first ground side transistor 26, connected in series between the input power supply $V_{CC}$ and ground potential, that output a voltage applied to a first primary electrode A of the pair of primary electrodes of the piezoelectric transformer 6, a second power supply side transistor 27 and a second ground side transistor 28, connected in series between the input power supply $V_{CC}$ and ground potential, that output a voltage applied to a second primary electrode B of the pair of primary electrodes of the piezoelectric transformer 6, an inductor 29 interposed between the first primary electrode A of the piezoelectric transformer 6 and the mid-point A' between the first power supply side transistor 25 and the first ground side transistor 26, a tube current detection circuit (CDET) 11 that detects the signal of an impedance element 8 as a signal indicating the condition of the load that is connected with the secondary electrode and that outputs the peak voltage or an averaged voltage thereof, a first error amplifier 12 that compares the output voltage of the tube current detection circuit 11 that is input at the inversion input terminal thereof and a first error reference voltage $V_{REF1}$ that is input at the non-inversion input terminal thereof and amplifies and outputs the difference voltage thereof, a voltage controlled oscillator (VCO) 13 that is controlled by the output voltage of the first error amplifier 12 and that outputs an oscillation clock CLK of a reference period and a triangular wave signal TRI synchronized therewith, an applied difference voltage generating circuit 14 that respectively attenuates the AC voltages applied to the pair of primary electrodes A and B of the piezoelectric transformer 6 and that outputs the difference between these voltages, an applied voltage detection circuit (VDET) 15a that detects the output of the applied difference voltage generating circuit 14 and that outputs the peak voltage or an averaged voltage thereof, a second error amplifier 16 that compares the output voltage of the applied voltage detection circuit 15a that is input at the inversion input terminal thereof and a second error reference voltage $V_{REF2}$ that is input at the non-inversion input terminal thereof and amplifies and outputs the difference voltage thereof, a PWM comparator 17 that compares the output voltage (the voltage at node C) of the second error amplifier 16 that is input at the non-inversion input terminal thereof and the triangular wave signal TRI that is input at the inversion input terminal thereof and that outputs a PWM signal P, a frequency divider (DIV) 18 that receives the oscillation clock CLK and that outputs a signal that changes its polarity every reference period thereof, an AND circuit 19 that computes the AND (logical product) of the output signal of the frequency divider 18 and the PWM signal P, and an AND circuit 20 that computes the AND of the inverted signal of the output signal of the frequency divider 18 and the PWM signal P. The output signal of the AND circuit 19 is input to the gate of the first power supply side transistor 25 and the gate of the first ground side transistor 26 respectively through the inversion buffers 21, 22. The output signal of the AND circuit 20 is input to the gate of the second power supply side transistor 27 and to the gate of the second ground side transistor 28 respectively through the inversion buffers 23, 24.

The applied difference voltage generating circuit 14 preferably includes series-connected resistors 31, 32 and 33, 34 that input AC voltage applied to the respective primary electrodes A, B of the piezoelectric transformer 6, an amplifier 36 that amplifies and outputs the difference voltages between the voltage (which is input to the non-inversion input terminal thereof) of the mid-point between the series-connected resistors 31, 32 and the voltage (which is input to the inversion input terminal thereof) of the mid-point between the series-connected resistors 33, 34, and a resistor 35 that is interposed between the output terminal and the inversion input terminal of the amplifier 36. The tube current detection circuit 11 and the applied voltage detection circuit 15a respectively detect input signals and output the peak voltage or an averaged voltage thereof. Since these circuits are ordinary circuits including a diode, a resistor and a capacitor, a description thereof will be omitted.

Figure 2:
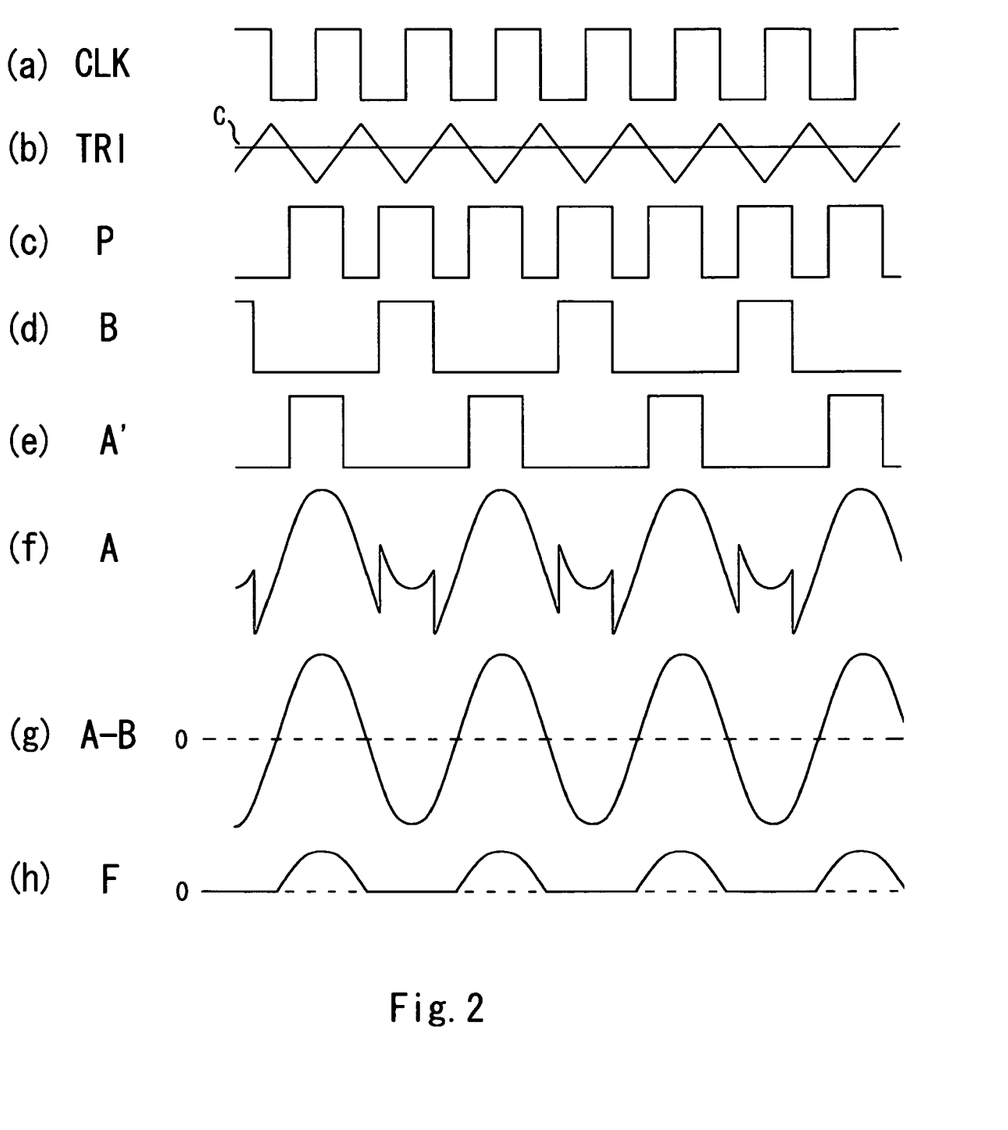
FIG. 2 is a waveform diagram of various sections of the piezoelectric transformer drive circuit and cold cathode tube lighting apparatus of FIG. 1.

The overall operation of the cold cathode tube lighting apparatus 1 is substantially the same as that of the cold cathode tube lighting apparatus 101 described previously, so further description thereof will be omitted. The operation of the piezoelectric transformer drive circuit 5a is very different from that of the piezoelectric transformer drive circuit 105 described previously, and will next be described. First of all, FIGS. 2(a) to 2(h) show the voltage waveforms of the various sections for generating AC voltage applied to the primary electrodes A, B of the piezoelectric transformer 6 in accordance with a preferred embodiment of the present invention. FIG. 2(a) shows an oscillation clock CLK of reference period that is output from the voltage controlled oscillator 13 and FIG. 2(b) shows a triangular wave signal TRI thereof. FIG. 2(c) shows a PWM signal P that is output from a PWM comparator 17. The PWM signal P is output as a result of comparing the triangular wave signal TRI and the output voltage (the voltage at node C) of the second error amplifier 16. The AND circuit 19 computes the AND of this PWM signal P and the output signal of the frequency divider 18. The result is then inverted by the inversion buffers 21 and 22 and input to the gate of the first power supply side transistor 25 and to the gate of the first ground side transistor 26. In addition, the AND circuit 20 computes the AND of this PWM signal P and the inverted signal of the output signal of the frequency divider 18. The result is then inverted by the inversion buffers 23 and 24 and input to the gate of the second power supply side transistor 27 and to the gate of the second ground side transistor 28. That is, the on time of the PWM signal P of the PWM comparator 17 is the time during which both the first power supply side transistor 25 and the second ground side transistor 28 are on or the time during which both the second power supply side transistor 27 and the first ground side transistor 26 are on. These transistors 25, 26, 27, and 28 are controlled by the output signal of the frequency divider 18 so that the time during which both the first power supply side transistor 25 and the second ground side transistor 28 are on and the time during which both the second power supply side transistor 27 and the first ground side transistor 26 are on are generated alternately in each period of the reference period.

FIG. 2(d) illustrates the voltage that is applied to the second primary electrode B of the piezoelectric transformer 6 and is also the square-wave AC voltage at the mid-point between the second power supply side transistor 27 and the second ground side transistor 28. FIG. 2(e) illustrates the square-wave AC voltage at the mid-point A' of the first power supply side transistor 25 and the first ground side transistor 26. FIG. 2(f) illustrates the voltage applied to the first primary electrode A. This is a waveform obtained by removing harmonic components by passing the square-wave AC voltage of the mid-point A' through an inductor 29 and then adding the square-wave AC voltage of the second primary electrode B thereto. What is important here is that the voltage of the first primary electrode A of the piezoelectric transformer 6 with reference to the second primary electrode B of the piezoelectric transformer 6 (relative voltage A-B of the primary electrodes of the piezoelectric transformer 6) should be have a substantially sine wave form as shown in FIG. 2(g). Using this, it is possible to perform feedback control so as to maintain the AC voltage that is applied to the primary electrodes A, B of the piezoelectric transformer 6 constant, as will be described.

Next, the operation whereby the AC frequency at the primary electrodes A, B of the piezoelectric transformer 6 is controlled by feeding back the tube current flowing in the cold cathode tube 7 will be described. The tube current detection circuit 11, the first error amplifier 12, the voltage controlled oscillator 13 and the frequency divider 18 of the piezoelectric transformer drive circuit 5a perform substantially the same operation as in the piezoelectric transformer drive circuit 105 described previously. Then, an AC voltage is applied to the pair of primary electrodes A, B of the piezoelectric transformer 6 with the period of the output of the frequency divider 18. Consequently, in the piezoelectric transformer drive circuit 5a, the frequency of the AC that is applied to the primary electrodes A, B of the piezoelectric transformer 6 is controlled by feedback of the tube current flowing in the cold cathode tube 7 in the same way as in the case of the piezoelectric transformer drive circuit 105.

Next, feedback control in order to keep constant the AC voltage applied to the primary electrodes A, B of the piezoelectric transformer 6 will be described. The AC voltages applied to the respective primary electrodes A, B of the piezoelectric transformer 6 are input to the applied difference voltage generating circuit 14 and are attenuated by the respective series-connected resistors 31, 32 and 33, 34. The difference between these voltages is then output by the amplifier 36 and resistor 35. For example, if the voltages of the primary electrodes A, B of the piezoelectric transformer 6 are assumed to be respectively $V_A$ and $V_B$ and the resistance of the resistor 32 is taken as R while the resistor 31 is 3 R, the resistances of the resistors 33 and 34 are both 2 R and the resistance of the resistor 35 is set as R, the output of the amplifier 36 is $(V_A-V_B)/2$. In other words, it becomes half the relative voltage A-B of the primary electrodes A, B of the piezoelectric transformer 6. Since the amplifier 36 cannot output a negative potential, as shown in FIG. 2(h), the output voltage waveform of the amplifier 36, i.e., the output voltage waveform of the applied difference voltage generating circuit 14, becomes a half wave.

The output voltage of the applied difference voltage generating circuit 14 is detected by the applied voltage detection circuit 15a and the peak voltage or an averaged voltage thereof is output. The second error amplifier 16 then compares the output voltage of the applied voltage detection circuit 15a with the second error reference voltage $V_{REF2}$ and amplifies and outputs the difference between these two voltages. As described above, the PWM signal P is output as a result of comparing the output voltage with the triangular wave signal TRI, using the PWM comparator 17. Then the relative voltage A-B (substantially a sine wave) of the primary electrodes A, B of the piezoelectric transformer 6 changes in accordance with the pulse width of the PWM signal P. Specifically, when the pulse width of the PWM signal P becomes large, the voltage of the mid-point A' between the first power supply side transistor 25 and the first ground side transistor 26 and the voltage of the mid-point between the second power supply side transistor 27 and the second ground side transistor 28 approach waveforms that are mutually completely inverted. When this happens, the amplitude of the relative voltage A-B of the primary electrodes A, B of the piezoelectric transformer 6 becomes large. On the other hand, when the pulse width of the PWM signal P becomes small, the amplitude of the relative voltage A-B of the primary electrodes A, B of the piezoelectric transformer 6 becomes small.

For example, when the AC voltage that is applied to the primary electrodes A, B of the piezoelectric transformer 6 becomes larger than a predetermined value, an operation takes place such that the pulse width of the PWM signal P becomes small and then the amplitude of the relative voltage A-B of the primary electrodes A, B of the piezoelectric transformer 6 becomes small. On the other hand, when the AC voltage applied to the primary electrodes A, B of the piezoelectric transformer 6 becomes smaller than the predetermined value, an operation takes place such that the pulse width of the PWM signal P becomes large and the amplitude of the relative voltage A-B of the primary electrodes A, B of the piezoelectric transformer 6 becomes large. Consequently, when the voltage of the input power supply $V_{CC}$ is high, the pulse width of the PWM signal P becomes small and on the contrary, when the voltage of the input power supply $V_{CC}$ is low, the pulse width of the PWM signal P becomes large. In this way, the piezoelectric transformer drive circuit 5a operates so as to perform feedback control of the AC voltage that is applied to the primary electrodes A, B of the piezoelectric transformer 6, thereby maintaining the AC voltage constant.

Figure 3:
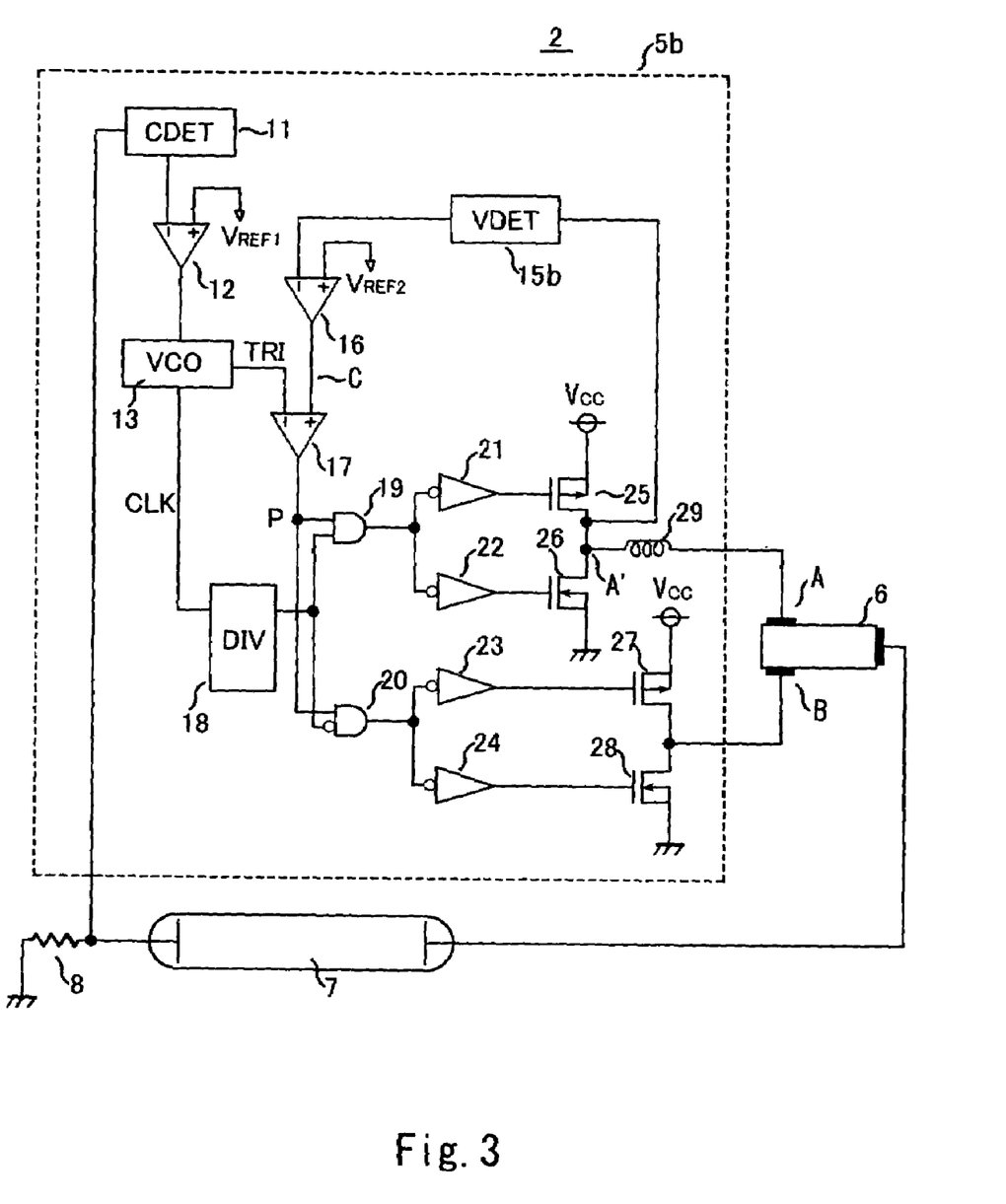
FIG. 3 is a circuit diagram of a piezoelectric transformer drive circuit according to another preferred embodiment of the present invention and a cold cathode tube lighting apparatus including the piezoelectric transformer drive circuit.

Next, a piezoelectric transformer drive circuit 5b according to another preferred embodiment of the present invention and a cold cathode tube lighting apparatus 2 including such a piezoelectric transformer drive circuit 5b are shown in FIG. 3. The cold cathode tube lighting apparatus 2 includes a piezoelectric transformer drive circuit 5b instead of the piezoelectric transformer drive circuit 5a in the cold cathode tube lighting apparatus 1 described above. The piezoelectric transformer drive circuit 5b, instead of the applied difference voltage generating circuit 14 and applied voltage detection circuit 15a in the piezoelectric transformer drive circuit 5a, includes an applied voltage detection circuit 15b that directly inputs and detects the voltage of the mid-point A' between the first power supply side transistor 25 and the first ground side transistor 26 and then outputs the averaged voltage thereof. The piezoelectric transformer drive circuit 5b performs feedback control so as to maintain constant the averaged voltage of the mid-point A' between the first power supply side transistor 25 and the first ground side transistor 26. So, in the same way as in the case of the piezoelectric transformer drive circuit 5a, when the voltage of the input power supply $V_{CC}$ is high, the pulse width of the PWM signal P becomes small and, on the contrary, when the voltage of the input power supply $V_{CC}$ is low, the pulse width of the PWM signal P becomes large. In this way, although the piezoelectric transformer drive circuit 5b does riot directly detect the AC voltage applied to the primary electrodes A, B of the piezoelectric transformer 6, it performs feedback control in the same way as in the case of the piezoelectric transformer drive circuit 5a of FIG. 1, so that effects due to voltage fluctuation of the input power supply $V_{CC}$ can be minimized. It should be noted that it would also be possible for the applied voltage detection circuit 15b to input the voltage of the mid-point between the second power supply side transistor 27 and the second ground side transistor 28, instead of the voltage of the mid-point A' between the first power supply side transistor 25 and the first ground side transistor 26.

As described above, the applied difference voltage generating circuit 14 and the applied voltage detection circuit 15a in the piezoelectric transformer drive circuit 5a, and the applied voltage detection circuit 15b in the piezoelectric transformer circuit 5b constitute respective modes of applied voltage detectors whereby a voltage corresponding to the amplitude of the voltage that is applied to at least one of the pair of primary electrodes is produced. The effects of voltage fluctuation of the input power supply $V_{CC}$ can be minimized by feedback control including the applied voltage detector such that the AC voltage that is applied to the primary electrodes A, B of the piezoelectric transformer 6 is kept constant. Thus, the piezoelectric transformer drive circuits 5a, 5b and cold cathode tube lighting apparatus 1, 2 including one of the piezoelectric transformer drive circuits 5a, 5b make it possible to achieve higher efficiency in a wide voltage range of the input power supply $V_{CC}$.

It should be noted that the present invention is not restricted to the preferred embodiments described above and various design modifications are possible within the scope of the appended claims. For example, although the frequency divider 18 of the piezoelectric transformer drive circuits 5a, 5b inputs an oscillation clock CLK, it would also be possible for the frequency divider to input the PWM signal P and to output a signal whose polarity changes at each reference period. Also, although the voltage of the mid-point A' between the first power supply side transistor 25 and the first ground side transistor 26 and the voltage of the mid-point between the second power supply side transistor 27 and second ground side transistor 28 have the same polarity as the PWM signal P of the PWM comparator 17, it would also be possible that these voltages have the opposite polarity as the PWM signal P if the inversion buffers 21 to 24 are of a non-inversion type. In this case also, the amplitude of the relative voltage A-B of the primary electrodes A, B of the piezoelectric transformer 6 is determined by the time during which the first power supply side transistor 25 and the second ground side transistor 28 are both on and the time during which the second power supply side transistor 27 and the first ground side transistor 26 are both on. It is also possible to provide a further inductor between the mid-point between the second power supply side transistor 27 and the second ground side transistor 28 and the second primary electrode B of the piezoelectric transformer 6.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A drive circuit for a piezoelectric transformer having a pair of primary electrodes and a secondary electrode for stepping up an AC voltage applied to the pair of primary electrodes and outputting a resultant voltage from the secondary electrode, the drive circuit comprising:

a first power supply side transistor and a first ground side transistor connected in series between an input power supply and ground potential and arranged to output a voltage that is applied to a first primary electrode of the pair of primary electrodes of the piezoelectric transformer;

a second power supply side transistor and a second ground side transistor connected in series between the input power supply and ground potential and arranged to output a voltage that is applied to a second primary electrode of the pair of primary electrodes of the piezoelectric transformer;

an inductor interposed between the first primary electrode and a mid-point between the first power supply side transistor and the first ground side transistor;

a tube current detection circuit that is arranged to detect a signal indicating a condition of a load that is connected to the secondary electrode;

a first error amplifier that is arranged to compare an output voltage of the tube current detection circuit and a first error reference voltage;

a voltage controlled oscillator that is arranged to be controlled by an output voltage of the first error amplifier and that outputs an oscillation clock of a reference period and a triangular wave signal synchronized therewith;

an applied voltage detector that is arranged to produce a voltage corresponding to an amplitude of the voltage that is applied to at least one of the pair of primary electrodes;

a second error amplifier that is arranged to compare the voltage output by the applied voltage detector and a second error reference voltage;

a PWM comparator that is arranged to compare an output voltage of the second error amplifier and the triangular wave signal to output a PWM signal; and a frequency divider that outputs a signal having a polarity that is changed every reference period; wherein an on time of the PWM signal is a time during which both the first power supply side transistor and the second ground side transistor are on or a time during which both the second power supply side transistor and the first ground side transistor are on; and the first power supply side transistor, the first ground side transistor, the second power supply side transistor and the second ground side transistor are arranged to be controlled by the output signal of the frequency divider such that the time during which both the first power supply side transistor and the second ground side transistor are on and the time during which both the second power supply side transistor and the first ground side transistor are on are generated alternately in each period of the reference period.

2. The piezoelectric transformer drive circuit according to claim 1, wherein the applied voltage detector includes an applied difference voltage generating circuit that is arranged to attenuate AC voltages that are applied to the pair of primary electrodes, respectively, and outputs a difference therebetween, and an applied voltage detection circuit that is arranged to detect an output of the applied difference voltage generating circuit and to output a peak voltage or an averaged voltage thereof.

3. The piezoelectric transformer drive circuit according to claim 1, wherein said applied voltage detector includes an applied voltage detection circuit that is arranged to detect an output of the mid-point between the first power supply side transistor and the first ground side transistor or an output of the mid-point between the second power supply side transistor and second ground side transistor and outputs an averaged voltage thereof.

4. The piezoelectric transformer drive circuit according to claim 1, further comprising a first AND circuit that is arranged to compute a AND of the output signal of the frequency divider and the PWM signal, and a second AND circuit that is arranged to compute a AND of an inverted signal of the output signal of the frequency divider and the PWM signal.

5. The piezoelectric transformer drive circuit according to claim 4, wherein an output signal of the first AND circuit is input to a gate of the first power supply side transistor and a gate of the first ground side transistor, and an output signal of the second AND circuit is input to a gate of the second power supply side transistor and to a gate of the second ground side transistor.

6. The piezoelectric transformer drive circuit according to claim 5, further comprising inversion buffers that are arranged such that the output signal of the first AND circuit and the output signal of the second AND circuit are output through the inversion buffers.

7. The piezoelectric transformer drive circuit according to claim 2, wherein the applied difference voltage generating circuit includes a plurality of series-connected resistors, an amplifier and a resistor that is located between an output terminal and an inversion input terminal of the amplifier.

8. The piezoelectric transformer drive circuit according to claim 7, wherein the plurality of series-connected resistors input the AC voltage applied to the primary electrodes of the piezoelectric transformer, and the amplifier amplifies and outputs difference voltages between a voltage which is input to a non-inversion input terminal thereof of a mid-point between first series-connected resistors and a voltage which is input to the inversion input terminal thereof of the mid-point between second series-connected resistors.

9. The piezoelectric transformer drive circuit according to claim 1, wherein the voltage that is applied to the second primary electrode of the piezoelectric transformer is a square-wave AC voltage at a mid-point between the second power supply side transistor and the second ground side transistor.

10. The piezoelectric transformer drive circuit according to claim 9, wherein the voltage applied to the first primary electrode of the piezoelectric transformer is a waveform obtained by removing harmonic components by passing the square-wave AC voltage of the mid-point between the first power supply side transistor and the first ground side transistor through said inductor and then adding the square-wave AC voltage of the second primary electrode thereto.

11. The piezoelectric transformer drive circuit according to claim 1, wherein the voltage applied to the first primary electrode of the piezoelectric transformer with reference to the voltage applied to the second primary electrode of the piezoelectric transformer has a substantially sine wave form.

12. The piezoelectric transformer drive circuit according to claim 1, wherein the frequency divider is arranged to receive one of the oscillation clock from the voltage controlled oscillator and the PWM signal from the PWM comparator, and outputs said signal having the polarity that changes at each reference period.

13. The piezoelectric transformer drive circuit according to claim 1, wherein a voltage of the mid-point between the first power supply side transistor and the first ground side transistor and a voltage of the mid-point between the second power supply side transistor and second ground side transistor have the same polarity as that of the PWM signal output by the PWM comparator.

14. The piezoelectric transformer drive circuit according to claim 1, wherein a voltage of the mid-point between the first power supply side transistor and the first ground side transistor and a voltage of the mid-point between the second power supply side transistor and second ground side transistor have an opposite polarity as that of the PWM signal output by the PWM comparator.

15. The piezoelectric transformer drive circuit according to claim 1, further comprising an inductor located between a mid-point between the second power supply side transistor and the second ground side transistor and the second primary electrode of the piezoelectric transformer.

16. A cold cathode tube lighting apparatus comprising:
a piezoelectric transformer drive circuit according to claim 1;
a piezoelectric transformer including a pair of primary electrodes and a secondary electrode and that is driven by the piezoelectric transformer drive circuit so as to step up the AC voltage applied to the pair of primary electrodes and output the resultant AC voltage from the secondary electrode;
a cold cathode tube connected as a load to the secondary electrode of the piezoelectric transformer; and
an impedance element connected in series with the cold cathode tube so that a tube current detection circuit of the piezoelectric transformer drive circuit detects a signal indicating a condition of the load connected to the secondary electrode.

17. A cold cathode tube lighting apparatus comprising:
a piezoelectric transformer drive circuit according to claim 2;
a piezoelectric transformer including a pair of primary electrodes and a secondary electrode and that is driven by the piezoelectric transformer drive circuit so as to step up the AC voltage applied to the pair of primary electrodes and output the resultant AC voltage from the secondary electrode;
a cold cathode tube connected as a load to the secondary electrode of the piezoelectric transformer; and
an impedance element connected in series with the cold cathode tube so that a tube current detection circuit of the piezoelectric transformer drive circuit detects a signal indicating a condition of the load connected to the secondary electrode.

18. A cold cathode tube lighting apparatus comprising:
a piezoelectric transformer drive circuit according to claim 3;
a piezoelectric transformer including a pair of primary electrodes and a secondary electrode and that is driven by the piezoelectric transformer drive circuit so as to step up the AC voltage applied to the pair of primary electrodes and output the resultant AC voltage from the secondary electrode;
a cold cathode tube connected as a load to the secondary electrode of the piezoelectric transformer; and
an impedance element connected in series with the cold cathode tube so that a tube current detection circuit of the piezoelectric transformer drive circuit detects a signal indicating a condition of the load connected to the secondary electrode.

19. A cold cathode tube lighting apparatus comprising:
a piezoelectric transformer drive circuit according to claim 4;
a piezoelectric transformer including a pair of primary electrodes and a secondary electrode and that is driven by the piezoelectric transformer drive circuit so as to step up the AC voltage applied to the pair of primary electrodes and output the resultant AC voltage from the secondary electrode;

a cold cathode tube connected as a load to the secondary electrode of the piezoelectric transformer; and an impedance element connected in series with the cold cathode tube so that a tube current detection circuit of the piezoelectric transformer drive circuit detects a signal indicating a condition of the load connected to the secondary electrode.

20. A cold cathode tube lighting apparatus comprising:

a piezoelectric transformer drive circuit according to claim 9;

a piezoelectric transformer including a pair of primary electrodes and a secondary electrode and that is driven by the piezoelectric transformer drive circuit so as to step up the AC voltage applied to the pair of primary electrodes and output the resultant AC voltage from the secondary electrode;

a cold cathode tube connected as a load to the secondary electrode of the piezoelectric transformer; and an impedance element connected in series with the cold cathode tube so that a tube current detection circuit of the piezoelectric transformer drive circuit detects a signal indicating a condition of the load connected to the secondary electrode.

\* \* \* \* \*